United States Patent
Teng et al.

(10) Patent No.: US 7,852,228 B2
(45) Date of Patent: Dec. 14, 2010

(54) FAN SYSTEM AND DETECTOR THEREOF

(75) Inventors: Wen-Ping Teng, Taoyuan Hsien (TW);
Ming-Lung Liu, Taoyuan Hsien (TW);
Ming-Yen Lin, Taoyuan Hsien (TW);
Yueh-Lung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 12/607,672

(22) Filed: Oct. 28, 2009

(65) Prior Publication Data

US 2010/0047082 A1 Feb. 25, 2010

Related U.S. Application Data

(63) Continuation-in-part of application No. 11/647,472, filed on Dec. 29, 2006, now abandoned.

(30) Foreign Application Priority Data

Feb. 24, 2006 (TW) ............................. 95106253 A

(51) Int. Cl.
*G08B 21/00* (2006.01)

(52) U.S. Cl. ............... 340/648; 340/635; 318/434
(58) Field of Classification Search ............... 340/540, 340/635, 648, 657, 660; 318/430–434
See application file for complete search history.

(56) References Cited

U.S. PATENT DOCUMENTS

| 4,479,115 A | 10/1984 | Holzhauer |
| 4,977,375 A | 12/1990 | Toth |
| 5,889,469 A | 3/1999 | Mykytiuk et al. |

*Primary Examiner*—Jeffery Hofsass
(74) *Attorney, Agent, or Firm*—Birch, Stewart, Kolasch & Birch, LLP

(57) ABSTRACT

A fan system including a motor, a driving unit, and a detector is disclosed. The driving unit is electrically connected to the motor and generates a driving signal to drive the motor and a detection signal. The detector is electrically connected to an output terminal of the driving unit and receives a voltage signal and the detection signal. When the motor operates normally, the detector outputs an examined signal to the output terminal of the driving unit. When the motor operates abnormally, the driving unit asserts the detection signal, and the detector is controlled by the asserted detection signal to transform the examined signal to an alarm signal according to the voltage signal to detect the abnormal state.

19 Claims, 8 Drawing Sheets

FAN SYSTEM AND DETECTOR THEREOF

This application is a Continuation-In-Part of copending application Ser. No. 11/647,472 filed on Dec. 29, 2006, the entire contents of which are hereby incorporated by reference and for which priority is claimed under 35 U.S.C. §120, and under 35 U.S.C. 119(a) to Patent Application No. 095106253 filed in Taiwan on Feb. 24, 2006, all of which are hereby expressly incorporated by reference into the present application.

BACKGROUND OF THE INVENTION

1. Field of the Invention

The present invention relates to a detector, and in particular relates to a detector applied in a fan system.

2. Description of the Related Art

Electronic systems generate heat based on the amount of data they process. Because some electronic systems provide fast and continuous operations, heat dissipation devices for these electronic systems become more important nowadays. Various heat dissipation products are provided for users. However, fan systems are currently popular among the most.

Referring to FIG. 1, a conventional fan system 1 comprises a motor 10, a driving unit 20, and a rotation speed detection unit 30. The driving unit 20 is electrically connected to the motor 10 and receives an input voltage $V_{IN}$ to drive the motor 10. The rotation speed detection unit 30 is electrically connected to the driving unit 20 to detect the rotation speed of the motor 10 and output an examined signal $S_1$ through the driving unit 20. The examine signal $S_1$ is input to a monitor device 2 to determine the operation states of the motor 10.

Referring to FIGS. 2A and 2B, when the motor 10 is under a normal operation state, such as normal rotation speed, normal current output, and normal work temperature. The examined signal $S_1$ is a pulse signal or a pulse width modulation (PWM) signal. When the motor 10 is under an abnormal operation state, such as fan locked, uncontrolled rotation speed, and violent temperature variation. The examined signal $S_1$ generates a spike signal $S_a$ as shown in FIG. 2A, a high-level signal $S_b$ as shown in FIG. 2B and a low-level signal $S_c$ as shown in FIG. 2B according to restricted values of the driving unit 20. Therefore, the monitor device 2 generates a stop or restart command.

In general, the monitor device 2 can set the required signal according to user requirements, such as spike signal $S_a$, high-level signal $S_b$ and low-level signal $S_c$. If the required signal is the spike signal $S_a$, moreover, have two or more spike signals. It is easy to decide that there are continuous pulse signals to output. Thus, determining the motor 10 operation states of motor 10 is failed so that the monitor device 2 can not send commands immediately. However, if the required signal is the high-level signal $S_b$ or low-level signal $S_c$, it will be alternately changed therebetween while the magnetic poles of the motor 10 are switched. It causes the reading of the monitor device 2 to fail. The two conditions mentioned above generally exist in conventional fan systems. Accordingly, the disposition for a damage or abnormal operation of the motor 10 is necessary to improve.

BRIEF SUMMARY OF THE INVENTION

Accordingly, an object of the invention is to provide a detector, which generates forcibly an alarm signal so that monitoring is easier to enhance the security and utilization.

Another object of the invention is to provide a fan system using the foregoing detector, which is to solve the problem in the conventional fan system due to errors in reading signals by a monitor device when the fan system operates abnormally.

According to the foregoing objects and others, the present invention provides a detector electrically connected to a fan system and a monitor device. The detector receives a voltage signal and a detection signal, and the fan system outputs an examined signal to the monitor device to determine the operation states of the fan system. The fan system asserts the detection signal when the fan system operates abnormally. The detector comprises a switch element electrically connected to the fan system and receiving the asserted detection signal so that the fan system electrically is connected to a ground.

According to the foregoing embodiment, the present invention provides a detector electrically connected to a driving unit and a monitor device to receive a voltage signal and a detection signal. The fan system outputs an examined signal to the monitor device to determine operation states of the fan system. The fan system asserts the detection signal when the fan system operates abnormally. The detector comprises a first switch element electrically connected to the driving unit and turned on when the first switch element receives the asserted detection signal, and a second switch element electrically connected to the driving unit and the monitor device and turned off according to the voltage signal when the first switch element is turned on.

According to the foregoing objects and others, the present invention provides a fan system comprising a motor, a driving unit, and a detector. The driving unit is electrically connected to the motor. The driving unit further generates a driving signal to drive the motor and generates a detection signal. The detector is electrically connected to an output terminal of the driving unit and receives a voltage signal and the detection signal. When the motor operates normally, the detector outputs an examined signal to the output terminal of the driving unit. When the motor operates abnormally, the driving unit asserts the detection signal, and the detector is controlled by the asserted detection signal to transform the examined signal to an alarm signal according to the voltage signal to detect the abnormal state.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
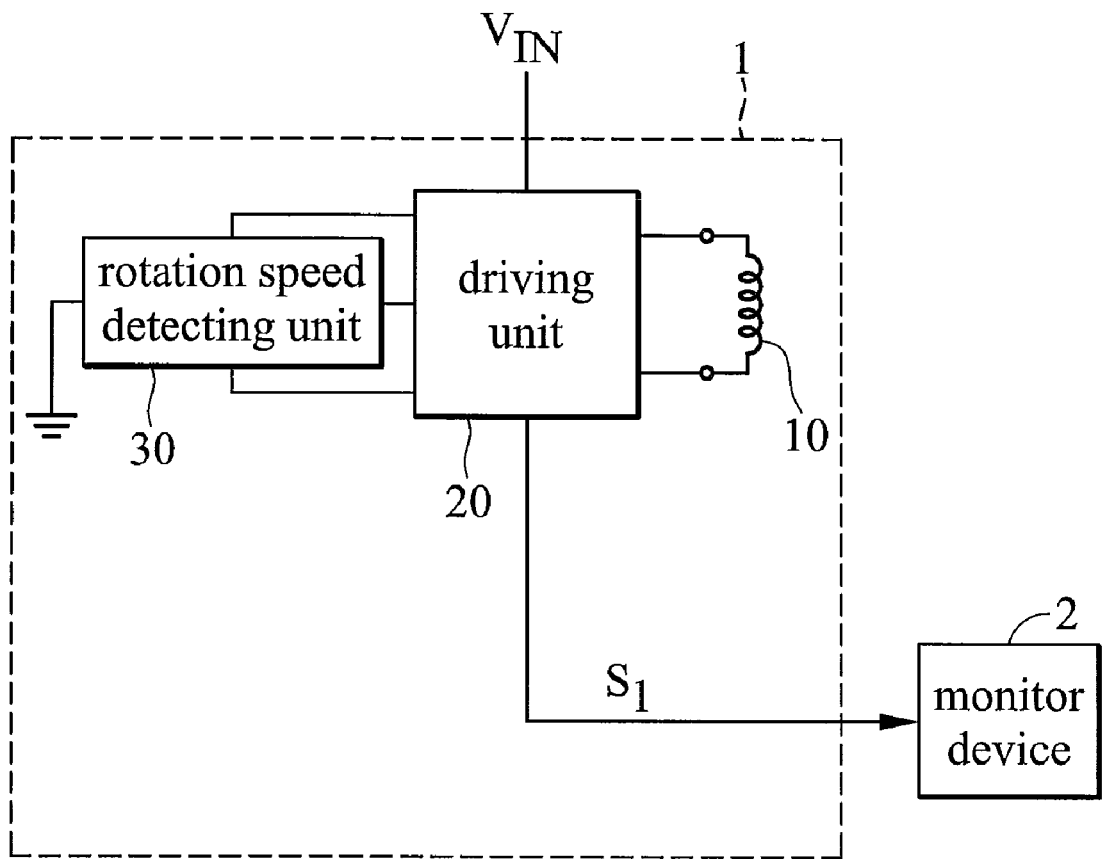
FIG. 1 depicts a conventional fan system.
Figure 2A:
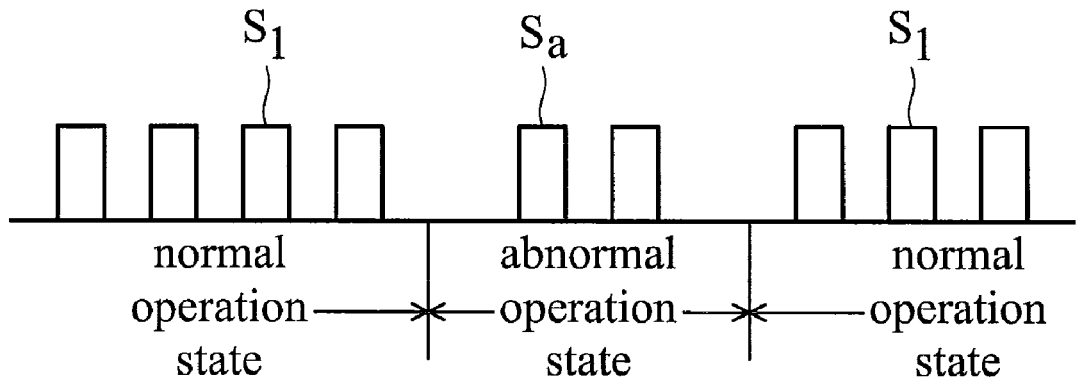
FIG. 2A shows one waveform of an examined signal in the conventional fan system.
Figure 2B:
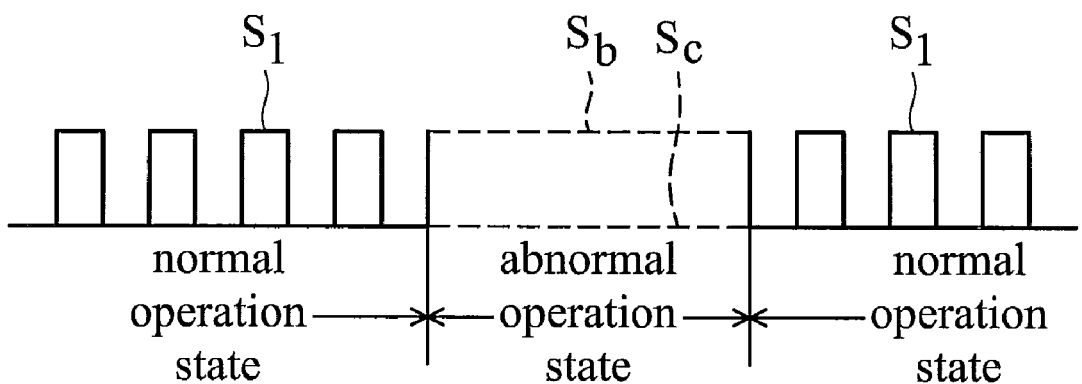
FIG. 2B shows another waveform of an examined signal in the conventional fan system.
Figure 3:
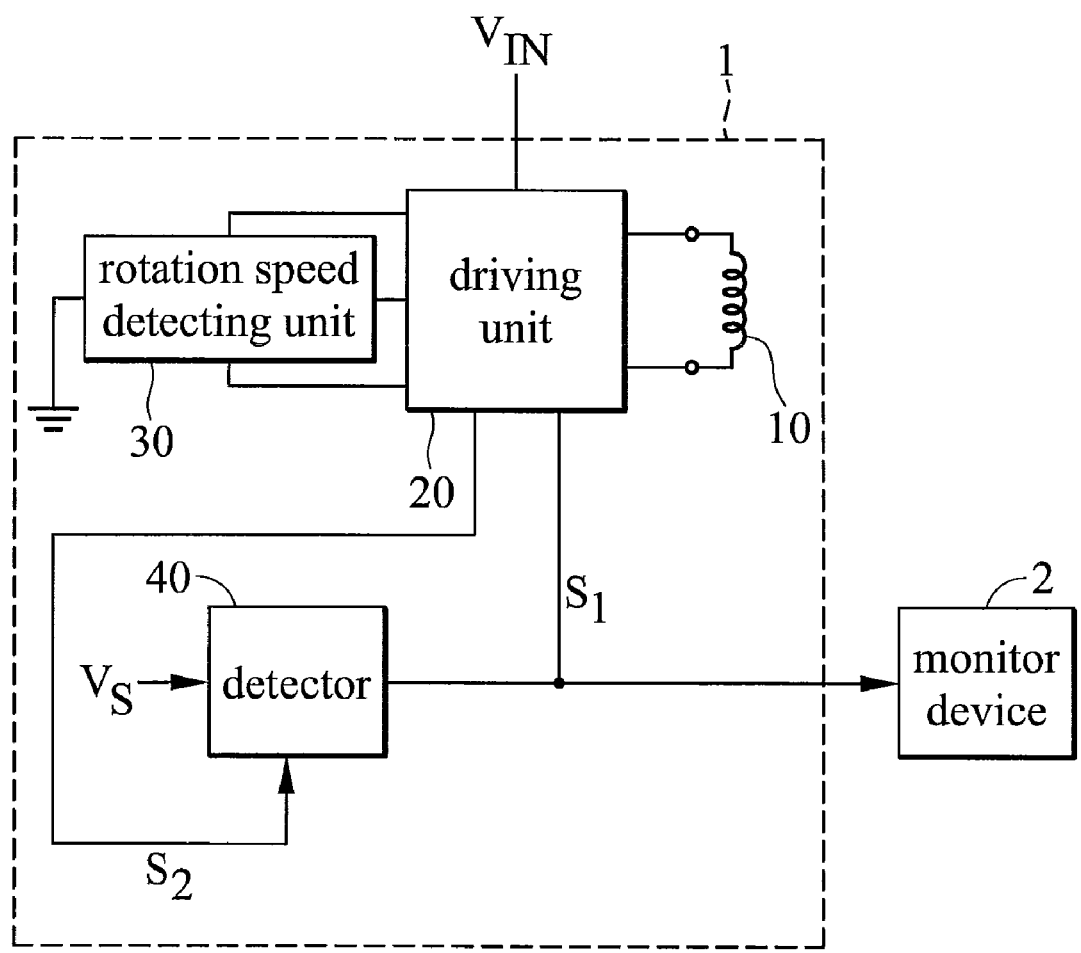
FIG. 3 depicts an embodiment of a fan system.

FIG. 3 is a fan system according to one preferred embodiment of this invention. A fan system 1 is electrically connected to a monitor device 2 and comprises a motor 10, a driving unit 20, and a detector 40. The driving unit 20 is electrically connected to the motor 10. The driving unit 20 receives an input voltage $V_{IN}$ to generate a driving signal to drive the motor 10. The detector 40 is electrically connected to an output terminal of the driving unit 20 and receives a voltage signal $V_s$. Moreover, the driving unit 20 generates a detection signal $S_2$ to the detector 40. When the motor 10 operates normally, the detector 40 is controlled by the detection signal $S_2$ to output an examined signal $S_1$. When the motor 10 operates abnormally, the detector 40 is controlled by the detection signal $S_2$ to transform the examined signal $S_1$ to an alarm signal according to the voltage signal $V_s$ to detect the abnormal state of the motor.

The driving unit 20 receives the input signal $V_{IN}$ and generates power to drive the motor 10. In this embodiment, the driving unit 20 can be an integrated circuit (IC), a microprocessor control unit (MCU), or a single chip. Therefore, the functions to drive the motor 10 can be preformed by hardware circuit structures or software programs.

The driving unit 20 is further electrically connected to a rotation speed detection unit 30. In this embodiment, the rotation speed detection unit 30 can be a Hall device or a Hall integrated circuit (IC). The rotation speed detection unit 30 continuously detects the operation states of the motor 10 and generates a feedback signal to the driving unit 20. The driving unit 20 thereby continuously generates the examined signal $S_1$. It notes that the rotation speed detection unit 30 can be combined into the driving unit 20 and the function of the rotation speed detection unit 30 is unchanged, hence further description in drawings are omitted.

Figure 4:
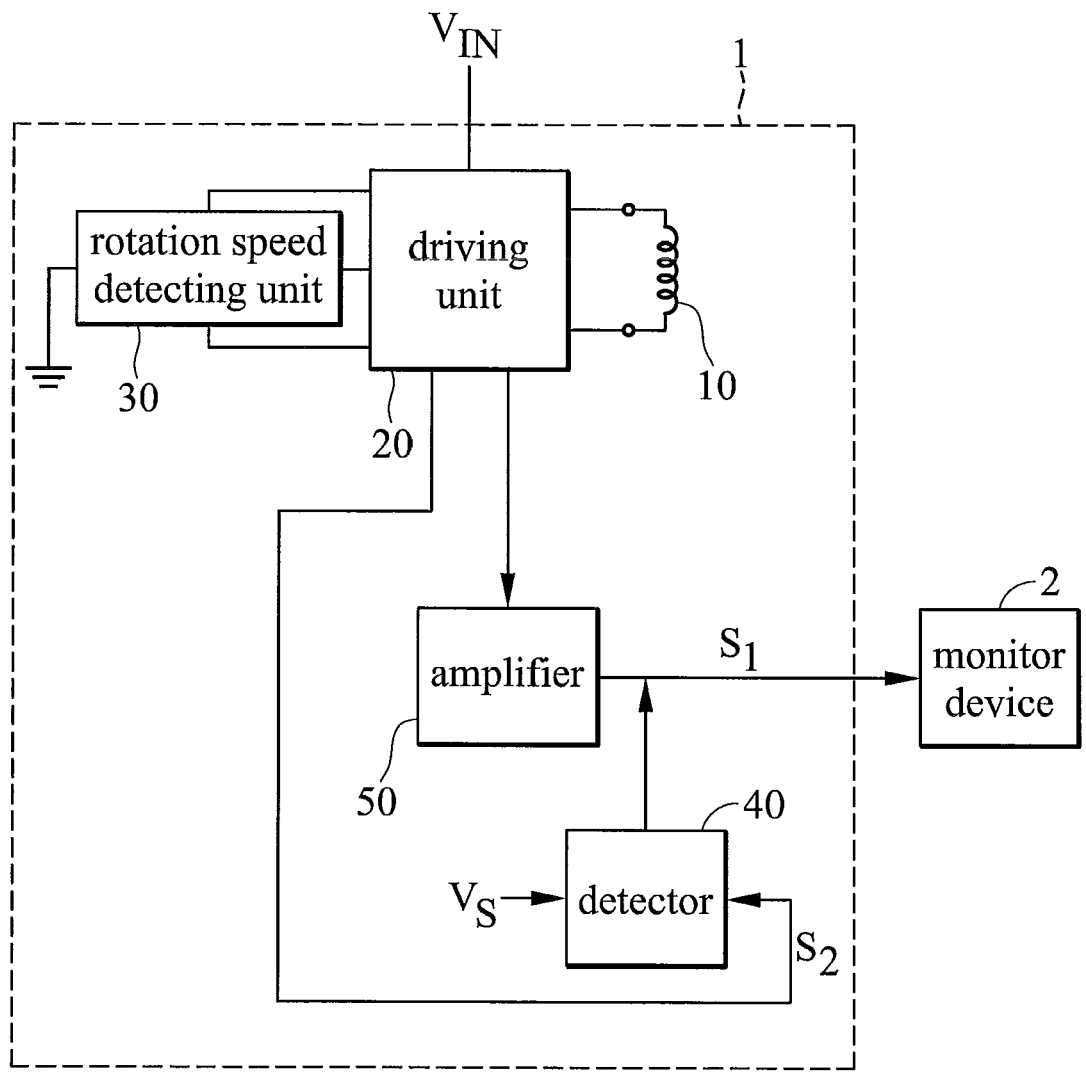
FIG. 4 depicts an embodiment of a fan system.

In this embodiment, the driving signal can be a pulse signal and in particular a pulse width modulation (PWM) signal. The examined signal $S_1$ can be a pulse signal or a pulse width modulation (PWM) signal when the motor 10 operates normally FIG. 4 depicts another embodiment of a fan system. The difference between the fan systems in FIG. 4 and FIG. 3 is the circuit structure between the driving unit 20 and the monitor device 2. Referring to FIG. 4, an amplifier 50 is electrically connected between the driving unit 20 and the monitor device 2. The amplifier 50 amplifies the examined signal $S_1$ output from the driving unit 20, thus the monitor device 2 can more precisely determine the operation states of the motor 10.

Figure 5A:
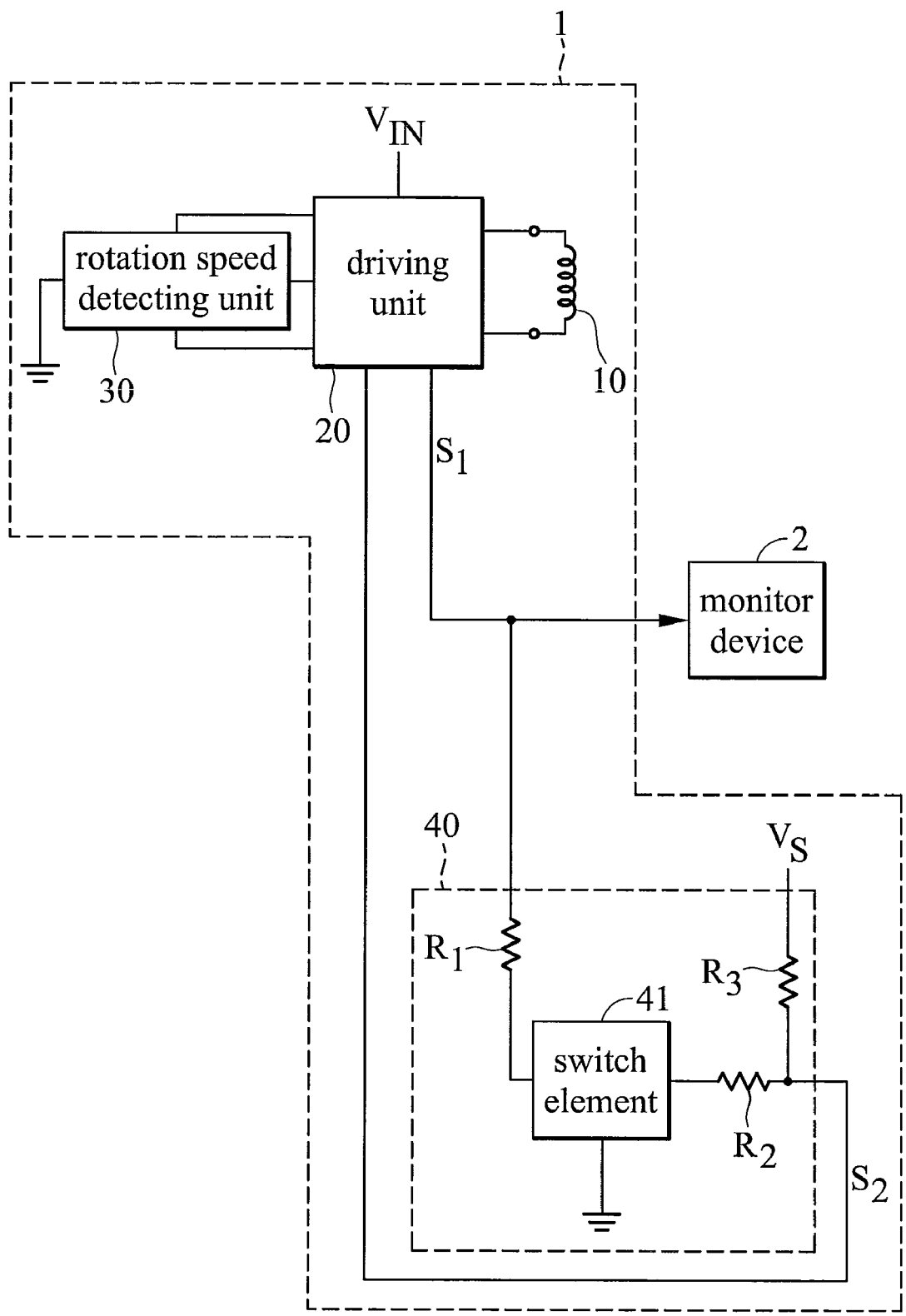
FIG. 5A depicts an embodiment of a detector in FIG. 3.
Figure 5B:
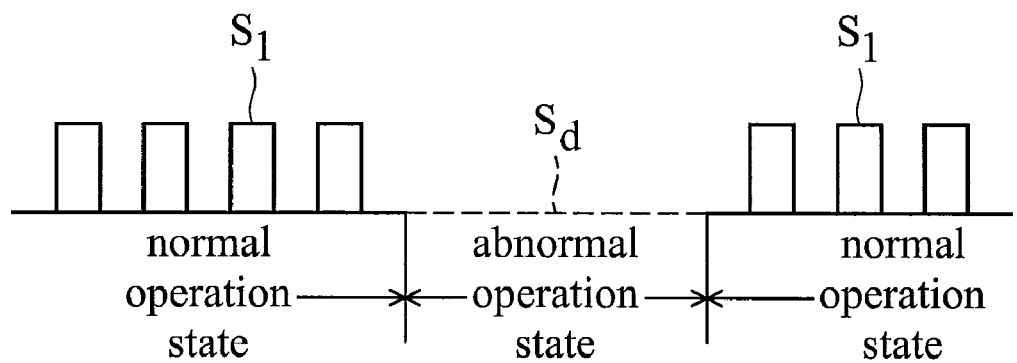
FIG. 5B shows a waveform of an examined signal in FIG. 5A.
Figure 5C:
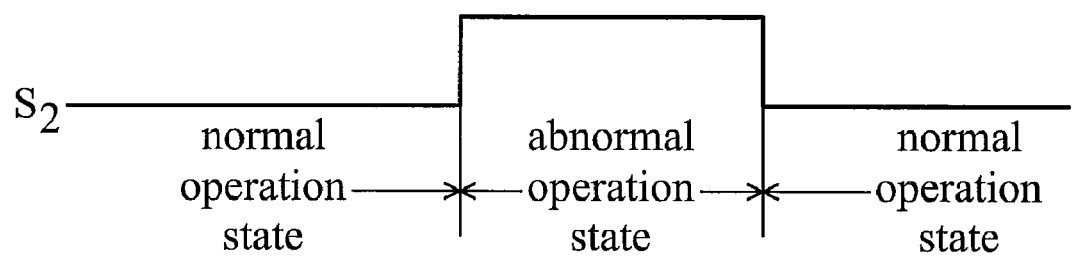
FIG. 5C shows a waveform of a detection signal in FIG. 5A.

FIG. 5A depicts one embodiment of the detector 40 in FIG. 3. Referring to FIG. 5A, the detector 40 comprises a switch element 41, a first resistor $R_1$, a second resistor $R_2$, and a third resistor $R_3$. The switch element 41 is electrically connected to the output terminal of the driving unit 20. Moreover, the switch element 41 receives the detection signal $S_2$ from the driving unit 20. When the driving unit 20 asserts the detection signal $S_2$ (that is when the detection signal $S_2$ is at a high level in the embodiment, as shown in FIG. 5C), the switch element 41 is turned on. Therefore, the output terminal of the driving unit 20 is electrically connected to a ground. The first resistor $R_1$ is electrically connected between the output terminal of the driving unit 20 and the switch element 41. The second resistor $R_2$ is electrically connected to the switch element 41, and the detection signal $S_2$ is received and transmitted to the switch element 41 through the resistor $R_2$. The third resistor $R_3$ is electrically connected to the second resistor $R_2$ and the voltage signal $V_s$ received and transmitted to the second resistor $R_2$.

When the motor 10 operates normally, the driving unit 20 de-asserts the detection signal $S_2$ (that is the detection signal $S_2$ is at a low level in the embodiment, as shown in FIG. 5C), and the switch element 41 is turned off according to the de-asserted detection signal $S_2$. The detector 40 does not influence the examined signal $S_1$ transmitted from the driving unit 20 to the monitor device 2, shown as the waveform in normal operation state in FIG. 5B. Referring to FIGS. 5B and 5C, when the motor 10 operates abnormally, such as the fan is locked by an object, the driving unit 20 asserts the detection signal $S_2$, so that the switch element 41 is thus turned on by the asserted detection signal $S_2$, and the output terminal of the driving unit 20 is electrically connected to the ground meanwhile. It means that the monitor device 2 reads the alarm signal $S_d$ which has a voltage value of zero as shown in FIG. 5B. Consequently, the examined signal $S_1$ is changed to a low-level. Thus, the value read by the monitor device 2 is not be influenced by switching of the magnetic poles of the motor 10. Meanwhile, the monitor device 2 generates a stop or restart command. If the monitor device 2 generates a restart command, the examined signal $S_1$ is restored to the previous waveform, as shown in FIG. 5B after the abnormal operation state is eliminated.

In this embodiment, the switch element 41 can be a bipolar junction transistor (BJT), a metal oxide semiconductor field effect transistor (MOSFET), or a junction field effect transistor (JFET). In other words, the switch element 41 can be an element that is turned on by triggering and electrically connects the output terminal of the driving unit 20 to the ground.

Figure 6A:
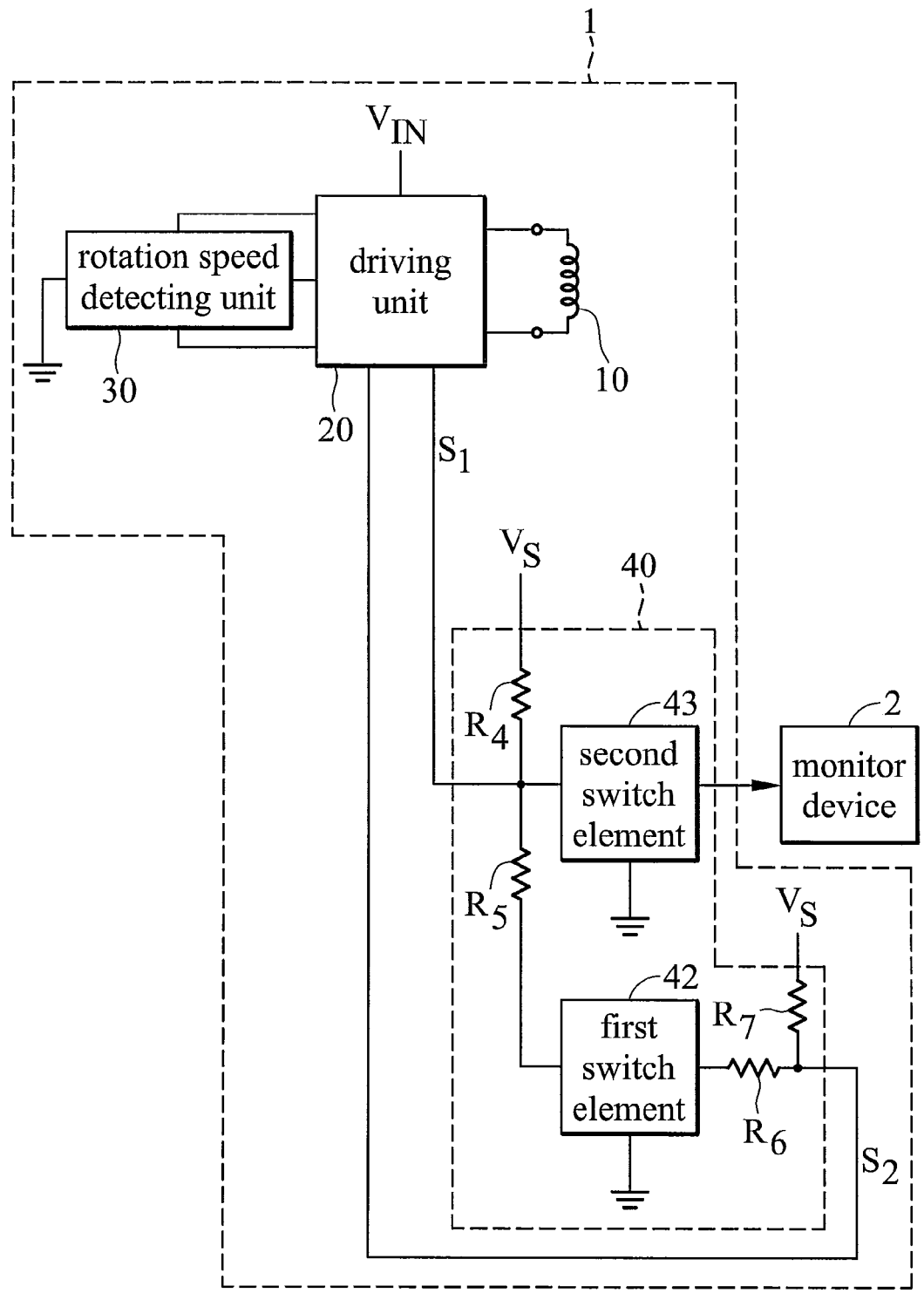
FIG. 6A depicts an embodiment of a detector in FIG. 3.
Figure 6B:
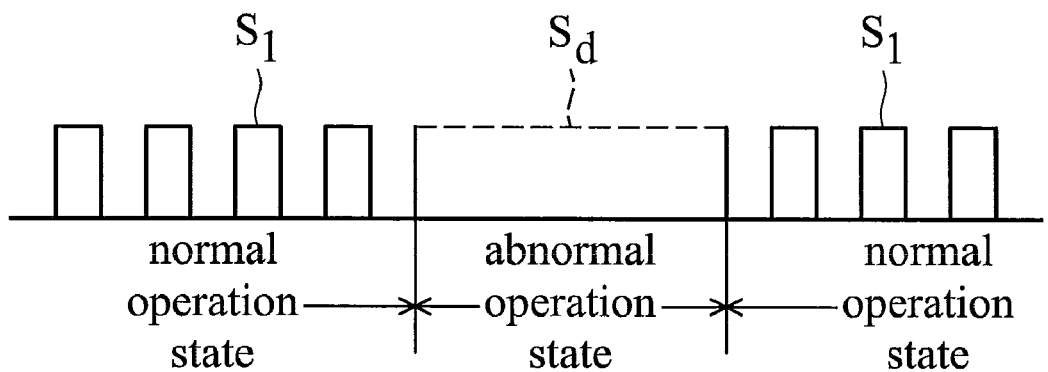
FIG. 6B shows a waveform of an examined signal in FIG. 6A.
Figure 6C:
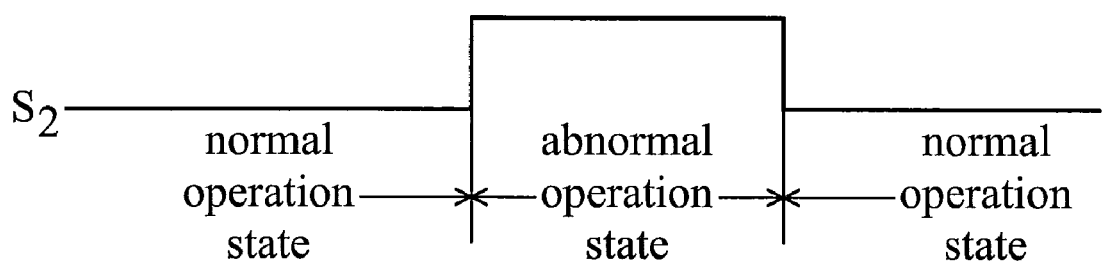
FIG. 6C shows a waveform of a detection signal in FIG. 6A

FIG. 6A depicts another embodiment of the detector 40 in FIG. 3. Referring to FIG. 6A, the detector 40 comprises a first switch element 42, a second switch element 43, a fourth resistor $R_4$, a fifth resistor $R_5$, a sixth resistor $R_6$, and a seventh resistor $R_7$. The first switch element 42 is electrically connected to the output terminal of the driving unit 20. Moreover, the first switch element 42 receives the detection signal $S_2$ from the driving unit 20. When the driving unit 20 asserts the detection signal $S_2$ (that is when the detection signal $S_2$ is at a high level in the embodiment, as shown in FIG. 6C), the first switch element 42 is turned on. The second switch element 43 is electrically connected between the output terminal of the driving unit 20 and the monitor device 2. The fourth resistor $R_4$ is electrically connected to the driving unit 20 and the second switch element 43 and receiving the voltage signal $V_s$. The fifth resistor $R_5$ is electrically connected between the driving unit 20 and the first switch element 42. When the first switch element 42 is turned on according to the asserted detection signal $S_2$, the fifth resistor $R_5$ is electrically connected to the ground. The sixth resistor $R_6$ is electrically connected to the first switch element 42, and the detection signal $S_2$ is received and transmitted to the first switch element 42 through the sixth resistor $R_6$. The seventh resistor $R_7$ is electrically connected to the sixth resistor $R_6$, and the voltage signal $V_s$ is received and transmitted to the sixth resistor $R_6$.

When the motor 10 operates normally, the driving unit 20 de-asserts the detection signal $S_2$ (that is the detection signal $S_2$ is at a low level in the embodiment, as shown in FIG. 6C), and the first switch element 42 is turned off according to the de-asserted detection signal $S_2$. The detector 40 does not influence the examined signal $S_1$ from the driving unit 20 to the monitor device 2, shown as the waveform in normal operation state in FIG. 6B. However, referring to FIGS. 6B and 6C, when the motor 10 operates abnormally, such as the fan is locked by an object, the driving unit 20 asserts the detection signal $S_2$, so that the first switch element 42 is turned on by the asserted detection signal $S_2$. The fourth resistor $R_4$ and the fifth resistor $R_5$ form a voltage divider. The voltage generated by the voltage divider has the same level as a voltage signal (not shown) set in the interior of the monitor device 2. The second switch element 43 is thus turned off so that the monitor device 2 can directly read the interior voltage signal, the value of which can be predetermined, as shown by the high-level alarm signal $S_d$ in FIG. 6B. Thus, switching the magnetic poles of the motor 10 does not influence the value read in the monitor device 2. Meanwhile, the monitor device 2 thereby generating a stop or restart command. If the monitor device 2 generates a restart command, the examined signal $S_1$ is restored to the previous waveform, as shown in FIG. 6B, after the abnormal operation state is eliminated.

As disclosed in the described embodiments of the fun system and detector thereof, when a motor operates abnormally, an examined signal output from a driving unit is transformed to a high or low-level alarm signal so that a monitor device 2 only read the high or low-level alarm signal. Due to the high or low-level alarm signal generated by the detector, a read error caused by switching high and low-levels when magnetic poles of the motor are switched is prevented. Thus, monitoring is easier and follow-up operations can be performed immediately, and furthermore, the security and utilization rate are enhanced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fan system, comprising
a motor;
a driving unit, electrically connected to the motor, for generating a driving signal to drive the motor and generating a detection signal; and
a detector, electrically connected to an output terminal of the driving unit, for receiving a voltage signal and the detection signal;
wherein when the motor operates normally, the detector outputs an examined signal to the output terminal of the driving unit; and
wherein when the motor operates abnormally, the driving unit asserts the detection signal, and the detector is controlled by the asserted detection signal to transform the examined signal to an alarm signal according to the voltage signal.

2. The fan system as claimed in claim 1, wherein the driving unit is an integrated circuit (IC), a microprocessor control unit (MCU), or a single chip.

3. The fan system as claimed in claim 1 further comprising a rotation speed detection unit electrically connected to the driving unit to feed the operation state of the motor back to the driving unit.

4. The fan system as claimed in claim 1, wherein the rotation speed detection unit is a Hall device or a Hall integrated circuit (IC).

5. The fan system as claimed in claim 1, wherein the driving signal and the examined signal are pulse signals or pulse width modulation (PWM) signals.

6. The fan system as claimed in claim 1, wherein the alarm signal is a direct-current voltage signal having a voltage value of zero.

7. The fan system as claimed in claim 6, wherein the detector comprises a switch element turned on according to the detection signal, so that the output terminal of the driving unit is electrically connected to a ground through the switch element.

8. The fan system as claimed in claim 7, wherein the detector further comprises:
a first resistor electrically connected between the output terminal of the driving unit and a first terminal of the switch element;
a second resistor electrically connected to a second terminal of the switch element and receiving the detection signal; and
a third resistor electrically connected to the second resistor and receiving the voltage signal.

9. The fan system as claimed in claim 8, wherein the alarm signal is a direct-current voltage signal provided by a monitor device.

10. The fan system as claimed in claim 1, wherein the detector further comprises:
a first switch element, wherein a first terminal of the first switch element is electrically connected to the output terminal of the driving unit and the second switch element, and a second terminal of the first switch element receives the detection signal; and
a second switch element, wherein the second switch element is electrically connected to the output terminal of the driving unit and receives the voltage signal.

11. The fan system as claimed in claim 10, wherein the detector further comprises:
a first resistor electrically connected to the second switch element and received the voltage signal;
a second resistor electrically connected to the first switch element and the second switch element;
a third resistor electrically connected to the first switch element and receiving the detection signal; and
a fourth resistor electrically connected to the third resistor and receiving the voltage signal.

12. The fan system as claimed in claim 1, further comprising an amplifier electrically connected to the driving unit to amplify the examined signal.

13. The fan system as claimed in claim 1, wherein when the motor operates normally, the driving unit de-asserts the detection signal, and the detector is controlled by the de-asserted detection to output the examined signal.

14. A detector of a fan system, electrically connected to a driving unit and a monitor device to receive a voltage signal and a detection signal, and the fan system outputting an examined signal to the monitor device to determine the operation states of the fan system and asserting the detection signal when the fan system operates abnormally, the detector comprising:
a switch element electrically connected to the driving unit for receiving the asserted detection signal so that the fan system is electrically connected to a ground.

15. The detector as claimed in claim 14, further comprising:
a first resistor electrically connected to the fan system and a first terminal of the switch element;

a second resistor electrically connected to a second terminal of the switch element and receiving the detection signal; and a third resistor electrically connected to the second resistor and receiving the voltage signal.

16. The detector as claimed in claim 14, wherein the examined signal is a pulse signal or a pulse width modulation (PWM) signal when the fan system operates normally, and a voltage value of the examined signal is zero when the fan system operates abnormally.

17. A detector of a fan system electrically connected to a driving unit and a monitor device to receive a voltage signal and a detection signal, and the fan system outputting an examined signal to the monitor device to determine operation states of the fan system and asserting the detection signal when the fan system operates abnormally, and the detector comprising:

a first switch element electrically connected to the driving unit and turned on when the first switch element receives the asserted detection signal; and a second switch element electrically connected to the driving unit and the monitor device and turned off according to the voltage signal when the first switch element is turned on.

18. The detector as claimed in claim 17, further comprising:

a first resistor electrically connected to the second switch element and receiving the voltage signal;

a second resistor electrically connected to the first switch element and the second switch element;

a third resistor electrically connected to the first switch element and receiving the detection signal; and a fourth resistor electrically connected to the third resistor and receiving the voltage signal.

19. The detector as claimed in claim 17, wherein the first switch element and the second switch element is a bipolar junction transistor (BJT), a metal oxide semiconductor field effect transistor (MOSFET), or a junction field effect transistor (JFET).

* * * * *